US007800189B2

(12) United States Patent
Caliano et al.

(10) Patent No.: US 7,800,189 B2
(45) Date of Patent: Sep. 21, 2010

(54) MICROFABRICATED CAPACITIVE ULTRASONIC TRANSDUCER

(75) Inventors: Giosuè Caliano, Rome (IT); Alessandro Caronti, Rome (IT); Riccardo Carotenuto, Rome (IT); Massimo Pappalardo, Rome (IT)

(73) Assignee: Esaote S.p.A., Casale, Monferrato (IT)

( * ) Notice: Subject to any disclaimer, the term of this patent is extended or adjusted under 35 U.S.C. 154(b) by 648 days.

(21) Appl. No.: 10/877,128

(22) Filed: Jun. 25, 2004

(65) Prior Publication Data

US 2005/0018536 A1 Jan. 27, 2005

(30) Foreign Application Priority Data

Jun. 25, 2003 (IT) ......................... RM2003A0318

(51) Int. Cl.
*H01L 29/72* (2006.01)

(52) U.S. Cl. ............................. 257/419; 257/E29.324; 438/53

(58) Field of Classification Search ................. 257/416, 257/419, E29.324; 367/181; 438/53
See application file for complete search history.

(56) References Cited

U.S. PATENT DOCUMENTS

| | | | | |
|---|---|---|---|---|
| 4,262,399 | A * | 4/1981 | Cady | 438/53 |
| 4,432,007 | A * | 2/1984 | Cady | 257/417 |
| 4,680,606 | A * | 7/1987 | Knutti et al. | 257/419 |
| 5,894,452 | A * | 4/1999 | Ladabaum et al. | 367/163 |
| 2001/0035700 | A1* | 11/2001 | Percin et al. | 310/324 |

* cited by examiner

*Primary Examiner*—Steven J Fulk
(74) *Attorney, Agent, or Firm*—Dickstein, Shapiro, LLP.

(57) ABSTRACT

The invention relates to a microfabricated capacitive ultrasonic transducer (20) comprising at least one thin plate (21), provided with a metallization (24), suspended over a conductive substrate (23) through supporting elements integrally coupled to the conductive substrate (23), the conductive substrate (23) forming one or more electrodes corresponding to said at least one thin plate (21), characterized in that said supporting elements comprise an ordered arrangement of columns or "pillars" (22) to which the thin plate (21) is integrally coupled, whereby the pillars (22) operate as substantially punctiform constraints. The invention further relates to a surface micro-mechanical process for fabricating such microfabricated capacitive ultrasonic transducers (20).

14 Claims, 11 Drawing Sheets

MICROFABRICATED CAPACITIVE ULTRASONIC TRANSDUCER

The present invention refers to a microfabricated capacitive ultrasonic transducer having a uniform structure and operating at extremely high frequencies, without spurious modes, with a very high efficiency and sensitivity during reception, and presenting a very low reflection factor.

Moreover, the present invention refers to the related surface micromechanical process of fabrication, which is simple and unexpensive.

In the second half of the last century a great number of echographic systems have been developed, capable to obtain information from surrounding means and from human body, which are based on the use of elastic waves at ultrasonic frequency.

At the present stage, the performance limit of these systems derives from the devices capable to generate and detect ultrasonic waves. In fact, thanks to the great development of microelectronics and digital signal processing, both the band and the sensitivity, and the cost of these systems as well are substantially determined by these specialised devices, generally called ultrasonic transducers (UTs). The majority of Uts are realised by using piezoelectric ceramic. When the ultrasounds are used for obtaining information from solid materials, it is sufficient the employment of the sole piezoceramic, since the acoustic impedance of the same is of the same magnitude order of that of solids; on the other hand, in most applications it is required generation and reception in fluids, and hence piezoceramic is insufficient because of the great impedance mismatching existing between the same and fluids and tissues of the human body.

In order to improve the performances of Uts, two techniques have been developed: matching layers of suitable acoustic impedance, and composite ceramic. With the first technique, the low acoustic impedance is coupled to the much higher one of the ceramic through one or more layers of suitable material a quarter of the wavelength thick; with the second technique, it is made an attempt to lower the acoustic impedance of piezoceramic by forming a composite made of this active material and an inert material having lower acoustic impedance (typically epoxy resin). These two techniques are nowadays simultaneously used, considerably increasing the complexity of implementation of these devices and consequently increasing costs and decreasing reliability. Also, the present multi-element piezoelectric transducers have strong limitations as to geometry, since the size of the single elements must be of the order of the wavelength (fractions of millimeter), and to electric wiring, since the number of elements is very large up to some thousands in case of array multi-element transducers.

The electrostatic effect is a valid alternative to the piezoelectric effect for carrying out ultrasonic transducers. Electrostatic ultrasonic transducers, made of a thin metallized membranes (mylar) typically stretched over a metallic plate, known as "backplate", have been used since 1950 for emitting ultrasounds in air, while the first attempts of emission in water with devices of this kind were on 1972. These devices are based on the electrostatic attraction exerted on the membrane which is forced to flexurally vibrate when an alternate voltage is applied between it and the backplate; during reception, when the membrane is set in vibration by an acoustic wave, incident on it, the capacity modulation due to the membrane movement is used to detect the wave.

More specifically, with reference to FIG. 1, the electrostatic transducer 1, the most known application of which is the condenser microphone, is made of a membrane 2 stretched by a tensile radial force $\tau$ in front of a backplate 3, through a suitable support 4 which assures a separation distance $d_g$ between membrane 2 and backplate 3.

If the membrane 2 is provided with a metallization 5 and the backplate 3 is conductive, this structure operates as a capacitor of capacitance $$C = \varepsilon \cdot \frac{A}{d_g}$$

having a fixed electrode (the backplate 3) and a movable one (the membrane 2) both of area A, being $\in$ the dielectric constant of air. By applying a continuous voltage $V_{DC}$ between the two electrode, through a resistor R, an electric charge $Q=V_{DC}C$ distributes along them. An incident acoustic wave puts in flexural vibration the membrane 2 and the related deformation makes the distance $d_g$ between the fixed electrode and the movable one vary, and thus consequently the capacitance C of the structure. The variation of capacitance, for the same charge Q, is balanced by an opposite variation of voltage and thus, as a result, at the ends of terminal M3, separated from the movable electrode through the blocking capacitor $C_b$, there appears an alternate voltage V of frequency equal to the one of the incident acoustic wave and of amplitude proportional, through surface A of the membrane 2, to the amplitude of the incident pressure. Such alternate voltage V may be detected on the resistor $R_{in}$ when terminal M3 is connected to terminal M2 through switch 6.

In order to generate acoustic waves in a fluid, an alternate voltage $V_{AC}$ is superimposed to the continuous voltage $V_{DC}$, by connecting terminal M3 to terminal M1 (as shown in FIG. 1). Because of the electrostatic attraction force $$F = \varepsilon \frac{A \cdot (V_{DC} + V_{AC})^2}{2d_g}$$

the membrane 2 is forced to flexurally oscillate with a vibration amplitude proportional to the applied alternate voltage $V_{AC}$. The correct equations putting the electric parameters, voltage and current, in relation with the mechanical ones, vibration velocity and force exerted by the membrane on the fluid, are well known and obtainable in literature.

The electrostatic transducer 1 follows the classic law of the invariability of the band-gain product. In fact, the band is limited by the first resonance frequency of the flexural vibration of the membrane 2, that, in the case when the membrane 2 is circular, is expressed by the relation:

$$f_0 = \frac{2.405}{2\pi a} \sqrt{\frac{\tau}{\rho_s}}$$

where a and $\rho_s$ are respectively the radius and the surface density of the membranes and r is the tensile stress (in N/m). It may be noted, from this expression, that in order to increase the resonance frequency, and thus the band, it is necessary to decrease the radius a of the membrane. However both the radiated power and the reception sensitivity depend on the area A of the membrane 2, whereby decreasing the membrane radius a the band increases, but its performances are also considerably reduced. Typically, the resonance frequency of these devices for emission in air is of the order of hundred of kHz, when the surface of the backplate 3 is obtained through turning or milling machining.

In order to enlarge the band, and at the same time have reasonably high sensitivities for practical applications, it is adopted the solution, shown in FIG. 2, of stretching the membrane 2 directly on the backplate 3'. Because of the surface microporosity of the backplate 3', the membrane 2 is effectively in contact with this only in some regions having extremely limited extension; in such a way, micro-cavities having small lateral size are defined.

In this way, the membrane 2 having radius a is subdivided into many micro-membranes of lateral size L<<a and the mean resonance frequency of the membrane increases from audio frequencies of the condenser microphone up to some hundreds of kHz, depending on the mean lateral size of the micro-cavities and on the applied tensile tension.

With reference to FIGS. 3*a* and 3*b*, in order to further increase the resonance frequency and to control its value, it has been employed a silicon backplate 3", suitably doped to make it conductive, the surface of which is micromachined. In fact, through the so-called "bulk micromachining" technique, it is possible to fabricate a backplate 3" with a controlled roughness made of a thin grid of pyramidal shaped engravings of step p.

The membrane 2 is in contact with the backplate 3" only on the vertexes of the micro-pyramids 7, thus creating well defined and regular micro-cavities 8 of very small size. The obtained frequency increase is essentially due to the reduced lateral size of the micro-cavities (about 50 micrometers).

With transducers of this type, known as "bulk micromachined ultrasonic transducers", maximum frequencies of about 1 MHz for emission in water and bandwidths of about 80% are reached; the device characteristics are strongly dependent on the tension applied to the membrane 2 which may not be easily controlled.

These transducers also suffer from another drawback. The membrane 2 is stretched on the backplate 3" and at the same time it is pressed onto the vertexes of the micro-pyramids 7 by the electrostatic attraction force generated by the bias voltage $V_{DC}$; when the excitation frequency increases, the vertexes of the micro-pyramids 7 tend not to operate as constraints, but rather a disjunction between the membrane 2 and these ones occurs. In fact, when the excitation frequency increases, the membrane 2 tends to vibrate according to higher order modes, i.e. according to modes presenting in-phase zones and in-counterphase zones with spontaneous creation of nodal with a step shorter than the one of the vertexes of the micro-pyramids 7. When such phenomenon begins to occur, the membranes 2 of the micro-cavities 8 do not vibrate any more all in phase, but there is a trend in creation of zones vibrating in counterphase, whereby the emitted radiation rapidly tends to decrease.

In order to overcome this limitation, it has been recently introduced a new generation of micromachined silicon capacitive ultrasonic transducers known as "surface micromachined ultrasonic transducers" or also as capacitive Micromachined Ultrasonic Transducers (cMUTs). These transducers are made of a bidimensional array of electrostatic micro-cells, electrically connected in parallel so as to be driven in phase, obtained through surface micromachining. In order to obtain transducers capable to operate in the range 1-15 MHz, typical in many echographic applications for non-destructive tests and medical diagnostics, the micro-membrane lateral size of each cell is of the order of ten microns; moreover, in order to have a sufficient sensitivity, the number of cells necessary to make a typical element of a multi-element transducer is of the order of some thousands.

With reference to FIGS. 4*a* and 4*b*, the cMUTs are made of an array of closed electrostatic micro-cells, the membranes 9 of which are constrained at the supporting edges of the same cell, also called as "rails" 10. The cell may assume circular, hexagonal, or also squared shape. In this type of transducer it is more appropriate to speak of thin plate or, better, micro-plate instead of membrane: in such case its flexural stiffness is mainly due to its thickness.

With respect to the transducer of FIGS. 3*a* and 3*b*, the fundamental difference is that each micro-cell is provided with its micro-plate 9 contrained at the edge 10 of the same micro-cell and hence mechanically uncoupled from the others. In the previous case the membrane is unique and the constraints (the vertexes of the micro-pyramids) only prevent the membrane moving in direction perpendicular to it and only in one sense; on the other hand, they do not prevent rotation. The micro-membranes of FIG. 3*a*, defined by the vertexes of the micro-pyramids 7, are elastically coupled since the constraint allow a micro-membrane to transmit to another one torsional stresses which causes the establishing of higher order modes which are responsible for frequency limitation.

On the contrary, cMUT transducers allow very high frequencies (20-30 MHz) to be reached, since the micro-plates 9 are uncoupled and frequency limitation is caused by higher order modes of each micro-plate 9 occurring at much higher frequencies.

The fundamental steps of a conventional process for fabricating cMUT transducer micro-cells through silicon micromachining technology are described in U.S. Pat. No. 5,894,452, and they are shown FIG. 5.

As shown in FIG. 5*a*, a sacrificial film 12 (for example silicon dioxide), the thickness H of which will define the distance $d_g$ between micro-plate 9 and the backplate, is deposited on a silicon substrate 11.

FIG. 5*b* shows that a second structural film 13, for example of silicon nitride, of thickenss h', is deposited on the first sacrificial film 12; a narrow hole 14 is formed in it, through classical photolithographic techniques, in order to create a path, shown in FIG. 5*c*, for removing the underlying sacrificial film 12.

A selective liquid solution is used for etching only the sacrificial film 12, whereby, as shown in FIG. 5*d*, a large cavity 15, circular in shape and having radius dependent on the etching time, is created under the structural film 13 which remains suspended over the cavity 15 and which is the micro-plate 9 of the underlying micro-cell.

Finally, the etching hole 14 is sealed by depositing a second silicon nitride film 16, as shown in FIG. 5*e*. With reference to FIG. 5*f*, the cells are completed by evaporating a metallic film 17 on the micro-plate 9 which is one of the electrodes, while the second one is made of the silicon substrate 11 heavily doped and hence conductive.

Technologies even more sophisticated than that described with reference to FIG. 5 have been proposed and used; however, all of them use the same basic criterion of creating the cavity by etching the sacrificial film through one or more holes formed at the centre or at the edges of the membrane itself.

In particular, holes may be located at the edges of the membrane or in correspondence with the rails, by presetting trenches blocking the selective etching. Although this last technique eliminates the need for a very accurate control of selective etching time as made in FIG. 5, in order to control geometry of the obtained device, however it introduces a considerable increase of the number of phases of the process of fabrication.

However, also the cMUT transducers, fabricated through any one of the described techniques, present some limitations.

First of all, through these fabrication techniques, the membrane is not made in a spatially uniform way because of the presence of holes. Also, their sealing presents not few difficulties resulting in a not neglectable defectiveness. Perfect sealing of all the micro-cells is fundamental in order to avoid that external agents (for example water) enter them lowering the applicable bias voltage very much.

Furthermore, the not perfect homogeneity of the membrane causes the occurrence of spurious flexural resonance modes which may alter and/or reduce the band of the device.

Still, due to technological reasons, the edges or rails 10 of the single micro-cell may not be too narrow; it follows as a result of it that about 30% of the transducer surface being occupied by the rails 10, does not contribute to radiation nor to reception. Consequently, under reception, the cMUT presents a high reflection factor since the surface occupied by the rails, being very stiff, almost totally reflects the acoustic wave. In echographic systems the reflection of the incident wave over the transducer surface is an unfavourable factor since it creates the multiple echoes phenomenon.

It is therefore an object of the present invention to provide a micro-fabricated capacitive ultrasonic transducer operating at extremely high frequencies, without spurious modes, with a very high efficiency and sensitivity during reception, and presenting a very low reflection factor.

It is therefore an object of the present invention to provide a surface micromechanical process for fabricating such ultrasonic transducer, which is simple, unexpensive, and reliable.

It is specific subject matter of this invention a micro-fabricated capacitive ultrasonic transducer comprising at least one thin plate, provided with a metallization, suspended over a conductive substrate through supporting elements integrally coupled to the conductive substrate, the conductive substrate forming one or more electrodes corresponding to said at least one thin plate, characterised in that said supporting elements comprise an ordered arrangement of columns or "pillars" to which the thin plate is integrally coupled, whereby the pillars operate as substantially punctiform constraints.

Always according to the invention, the thin plate may be integrally coupled to the conductive substrate along at least one perimeter portion through stiff constraints.

Still according to the invention, one or more pillars may have circular section.

Furthermore according to the invention, one or more pillars may have squared section.

Always according to the invention, i pillars may form an array ordered arrangement.

Still according to the invention, the thin plate may be subdivided by the pillars in a plurality of micro-cells, each one of said micro-cells having a polygonal shape comprising three or more vertexes, each one of said micro-cells being integrally coupled to pillars in correspondence with at least one part of the vertexes of the polygonal shape.

Furthermore according to the invention, the micro-cells of said plurality may have a squared polygonal shape, wherein the pillars are spaced apart with a step d.

Always according to the invention, the micro-cells of said plurality may have a rectangular polygonal shape.

Still according to the invention, the micro-cells of said plurality may have a regular hexagonal shape or a lozenge shape.

Furthermore according to the invention, the conductive substrate may comprise a conductive silicon substrate.

Always according to the invention, the conductive substrate may further comprise a layer of insulating material overlapping the conductive silicon substrate.

Still according to the invention, the insulating material layer may be a silicon dioxide layer.

Furthermore according to the invention, the conductive substrate may further comprise at least one overlapped metallic film for each electrode.

Always according to the invention, the conductive substrate may comprise a quartz substrate on which at least one metallic film is overlapped for each electrode.

Still according to the invention, the thin plate may comprise silicon nitride and/or polycrystalline silicon.

It is specific subject matter of this invention a surface micro-mechanical process for fabricating micromachined capacitive ultrasonic transducers according to any one of the preceding claims, characterised in that it comprises the following phases:

A. having a conductive substrate;
B. making a sacrificial layer overlapping said conductive substrate;
C. making in the sacrificial layer overlying the electrodes, through photolithographic techniques, a set of holes in correspondence with the positions of the pillars;
D. making a film of elastic material for each thin plate, overlying at least one electrode and having a thickness sufficient to seal said holes, the sacrificial layer underlying the elastic material film being accessible by at least one perimeter side of this one; and
E. releasing each thin plate of said elastic material through removal of the sacrificial layer by means of selective wet etching.

Always according to the invention, the process may further comprise, after phase E, the following phase:

F. making a film of said elastic material in correspondence with at least one perimeter side of each thin plate.

Still according to the invention, the process may further comprise, after phase E, the following phase:

G. making a metallization film over each thin plate.

Furthermore according to the invention, phase A may comprise the following sub-phases:

A.1 having a silicon substrate;
A.2 making a metallization film for each electrode.

Always according to the invention, between sub-phase A.1 and sub-phase A.2, phase A may further comprise the following sub-phase:

A.3 making a silicon dioxide layer.

Still according to the invention, phase A may comprise the following sub-phases:

A.4 having an insulating substrate, preferably of quartz;
A.5 making a metallization film for each electrode.

Furthermore according to the invention, phase B may comprise a deposition of a sacrificial layer, preferably a layer of chromium.

Always according to the invention, the holes made during phase C may be circular and/or squared.

Still according to the invention, phase D may comprise the following sub-phases:

D.1 depositing a thick layer of said elastic material all over the sacrificial layer;
D.2 thinning said thick layer of said elastic material through wet etching, by using a masking, down to discover the sacrificial layer in correspondence with at least one perimeter side of at least one electrode.

Furthermore according to the invention, said elastic material may be silicon nitride and/or polycrystalline silicon.

The present invention will be now described, by way of illustration and not by way of limitation, according to its preferred embodiments, by particularly referring to the Figures of the enclosed drawings, in which.

In the following of the description same references will be used to indicate alike elements in the Figures.

Figure 1:
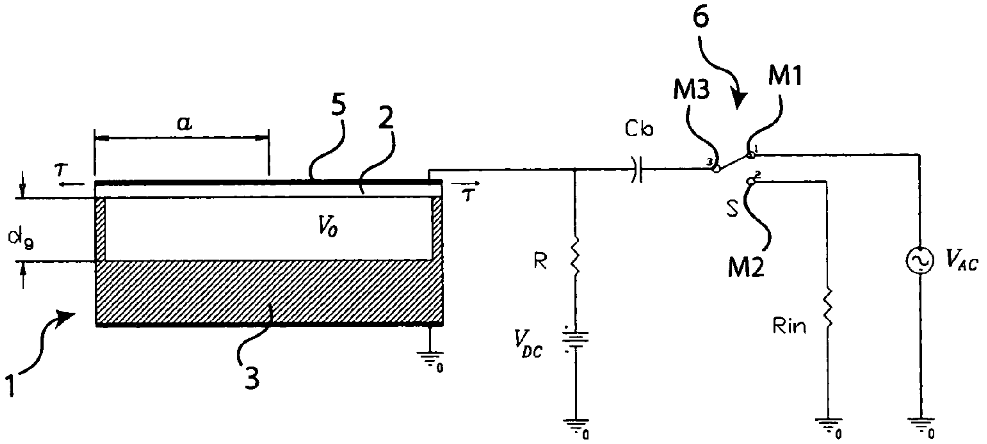
FIG. 1 shows a first electrostatic transducer according to the prior art.
Figure 2:
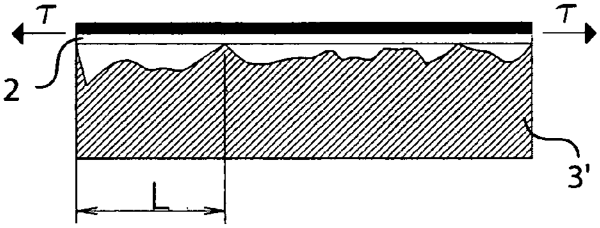
FIG. 2 shows a second electrostatic transducer according to the prior art.
Figure 3A:
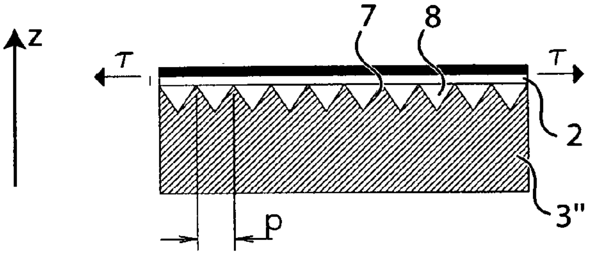
FIG. 3 shows a third electrostatic transducer according to the prior art.
Figure 3B:
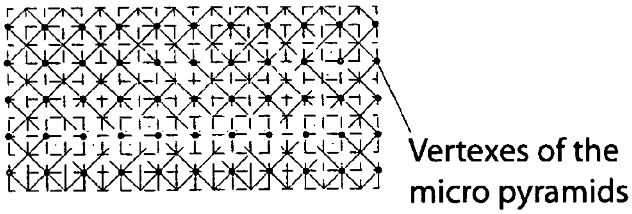
Figure 4A:
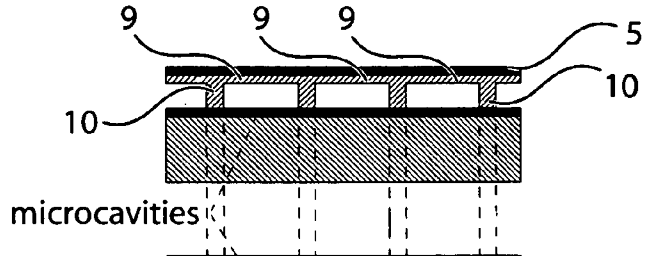
FIG. 4 shows a cMUT transducer according to the prior art.
Figure 4B:
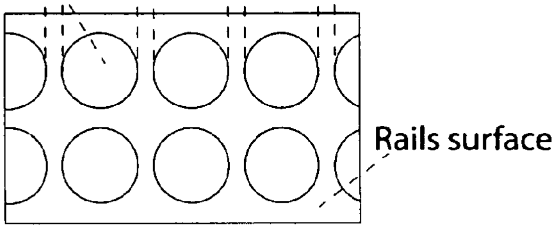
Figure 5:
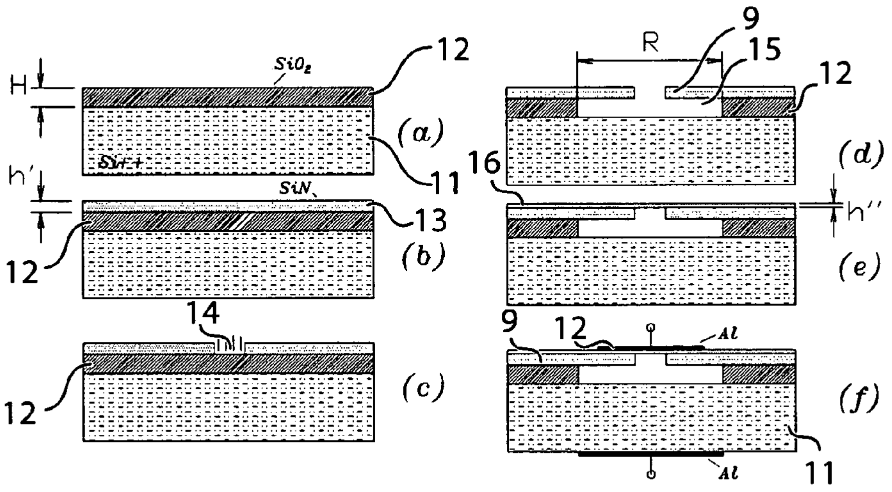
FIG. 5 shows a process of fabrication of the cMUT transducer of FIG. 4.
Figure 6A:
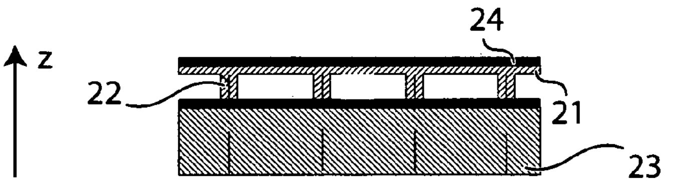
FIG. 6 shows a first embodiment of a micro-fabricated capacitive ultrasonic transducer according to the invention.
Figure 6B:
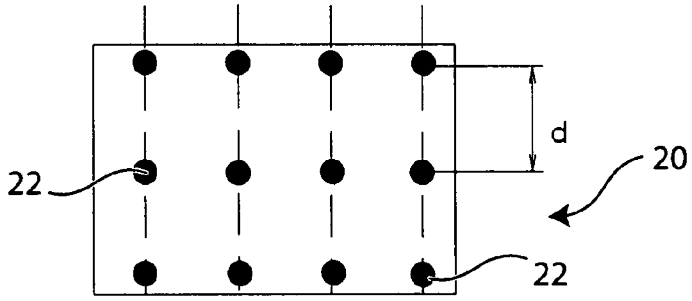
Figure 7A:
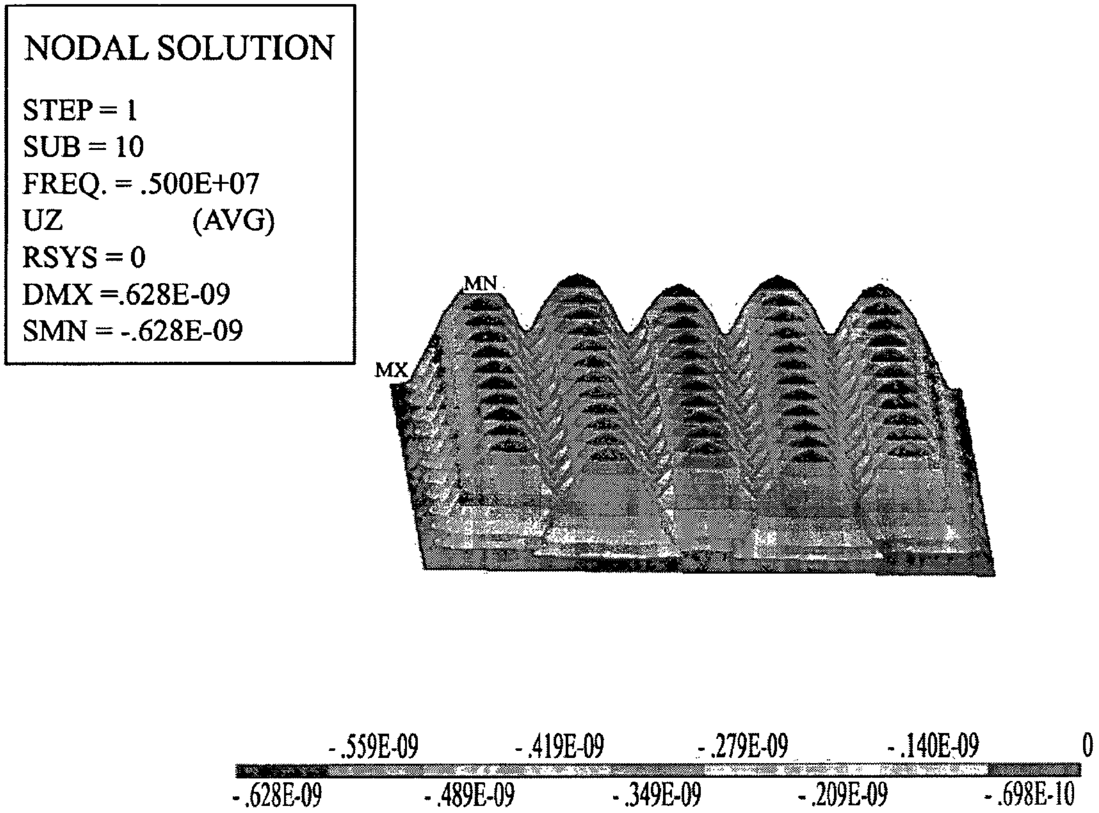
FIGS. 7-13 show the results of simulations carried out on the transducer of FIG. 6.
Figure 7B:
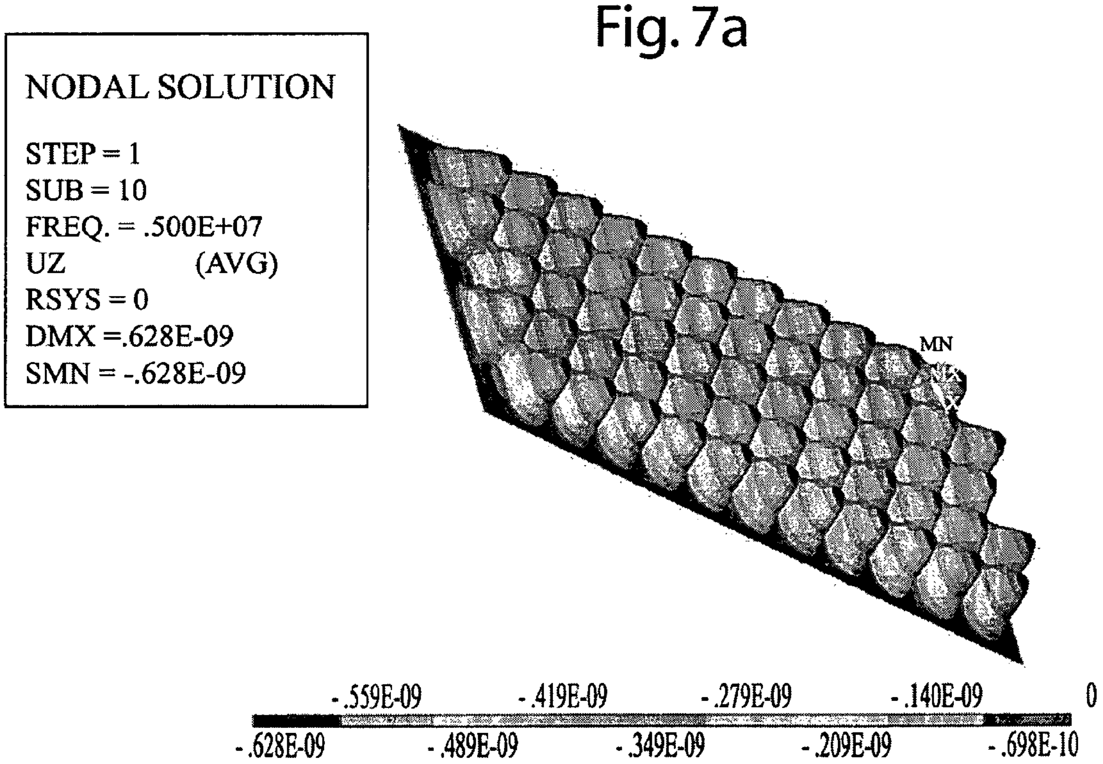
Figure 8A:
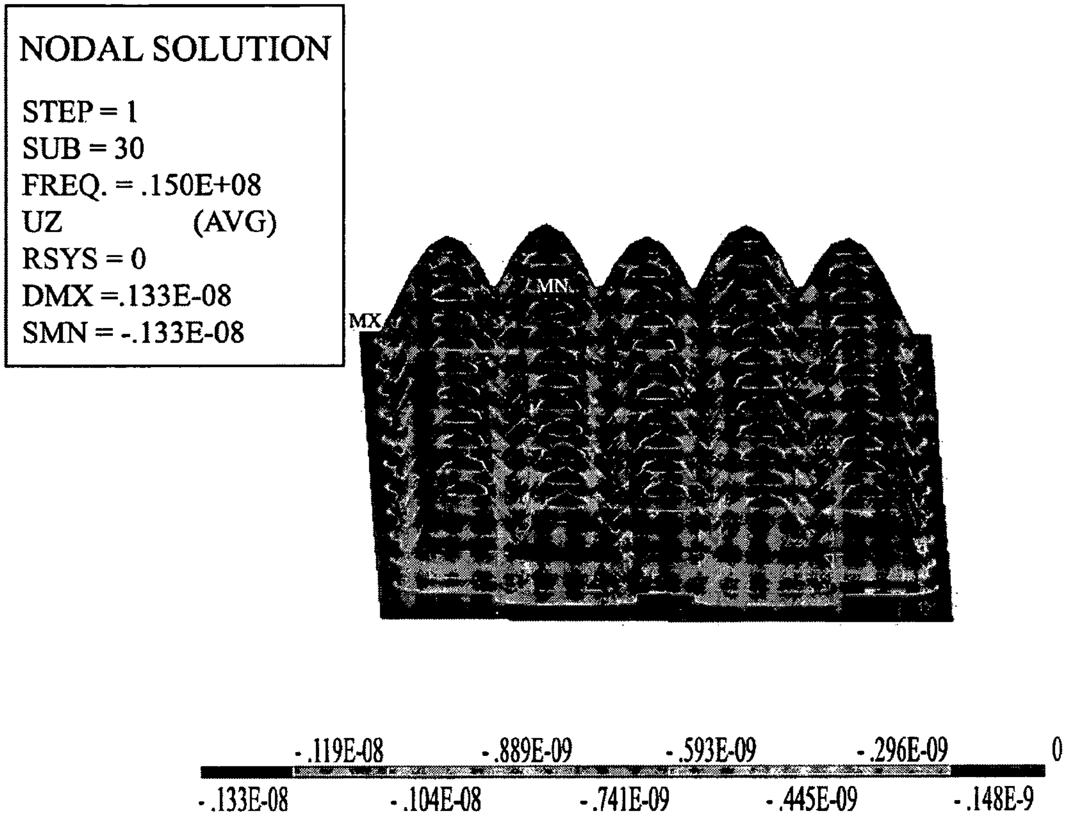
Figure 8B:
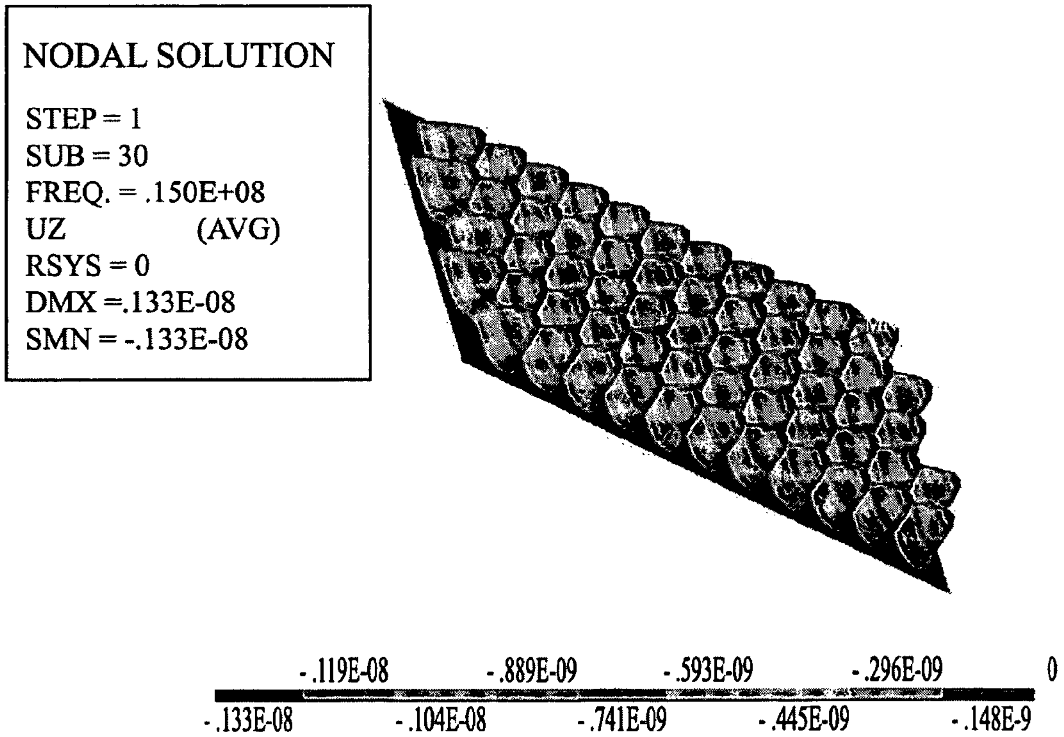
Figure 9A:
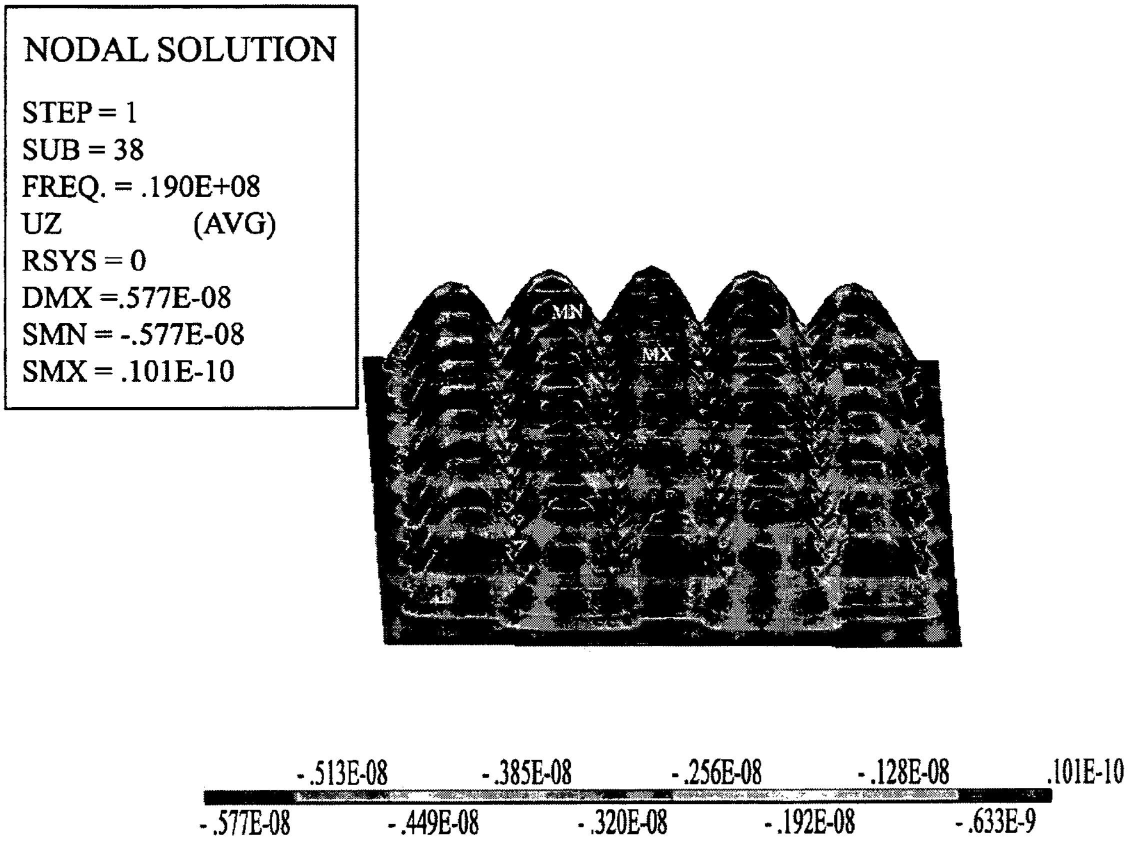
Figure 9B:
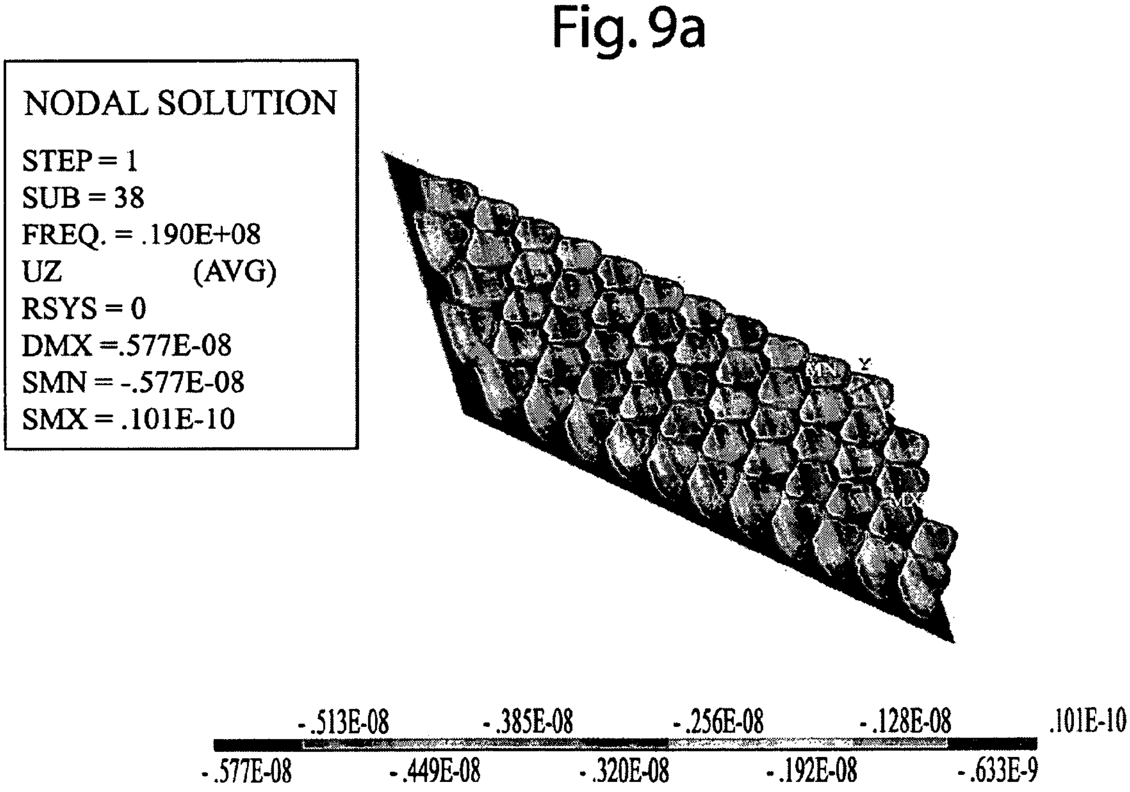
Figure 10A:
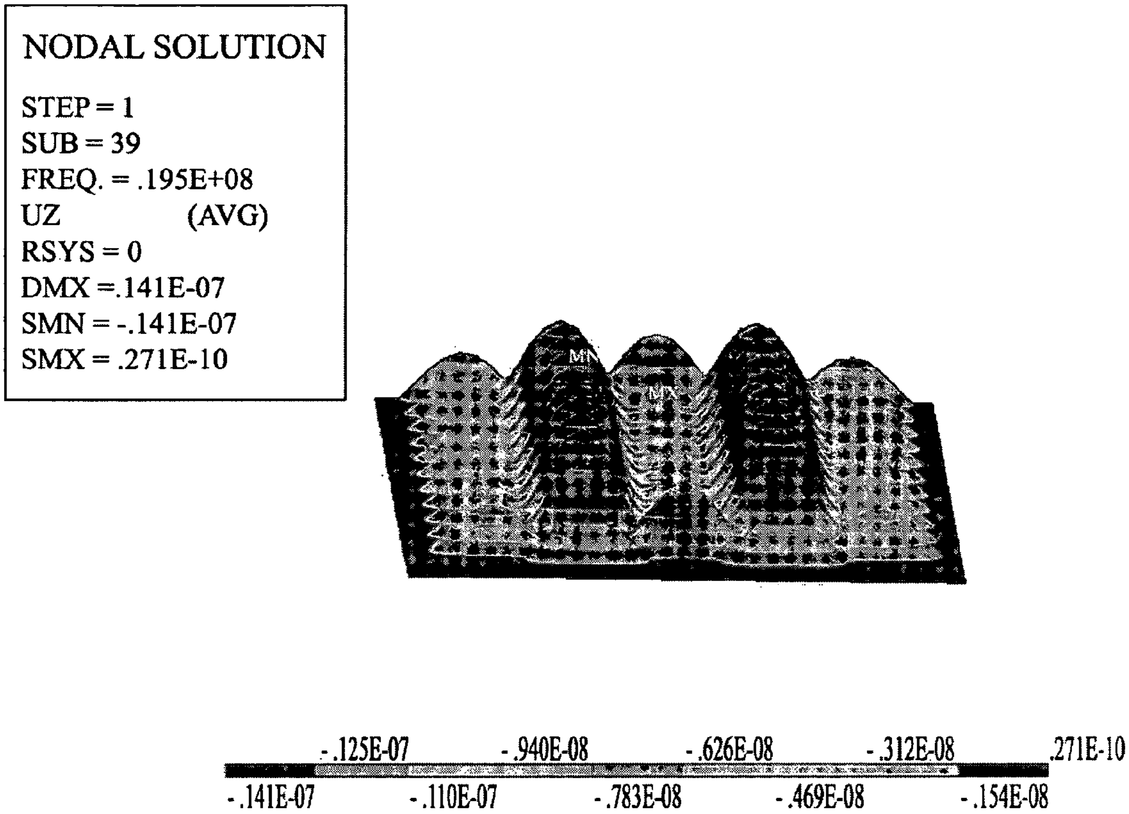
Figure 10B:
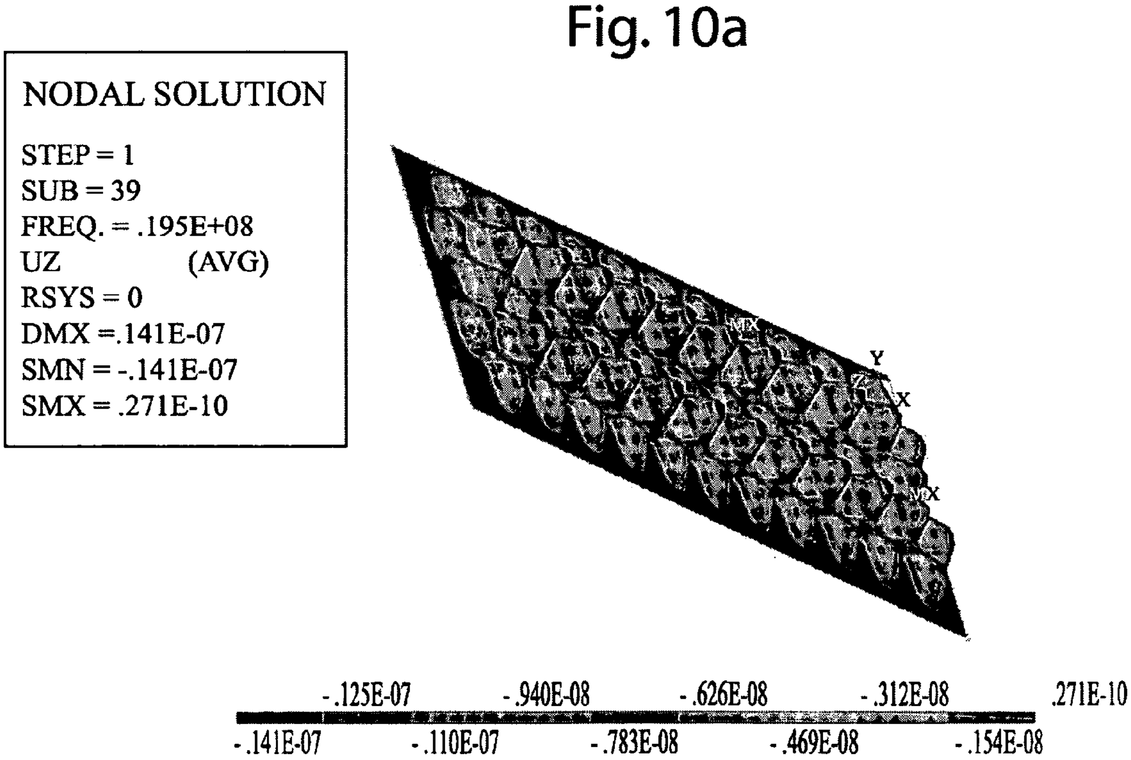
Figure 11A:
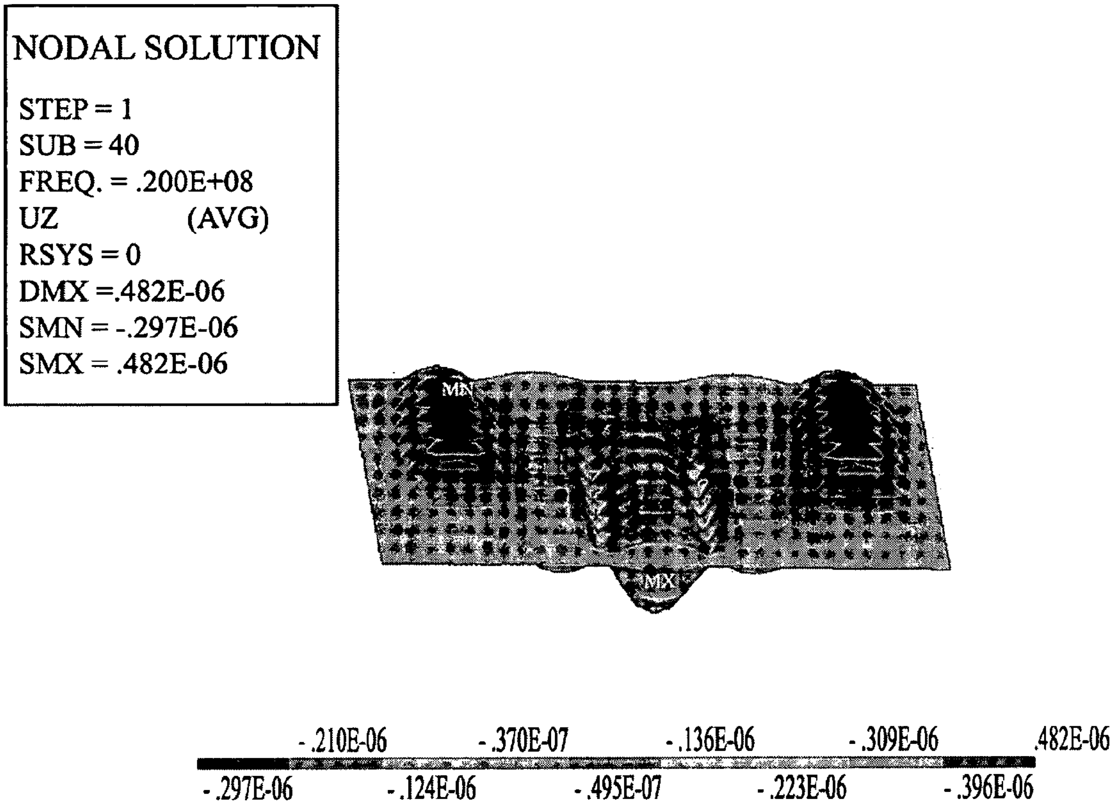
Figure 11B:
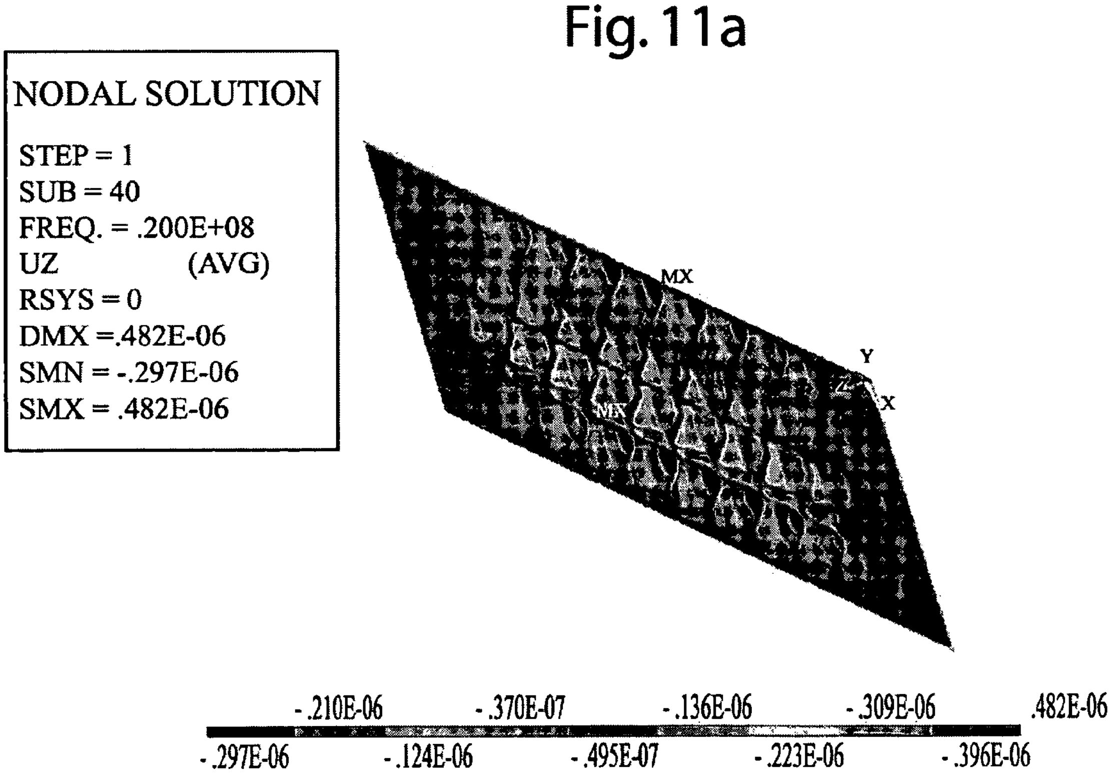
Figure 12A:
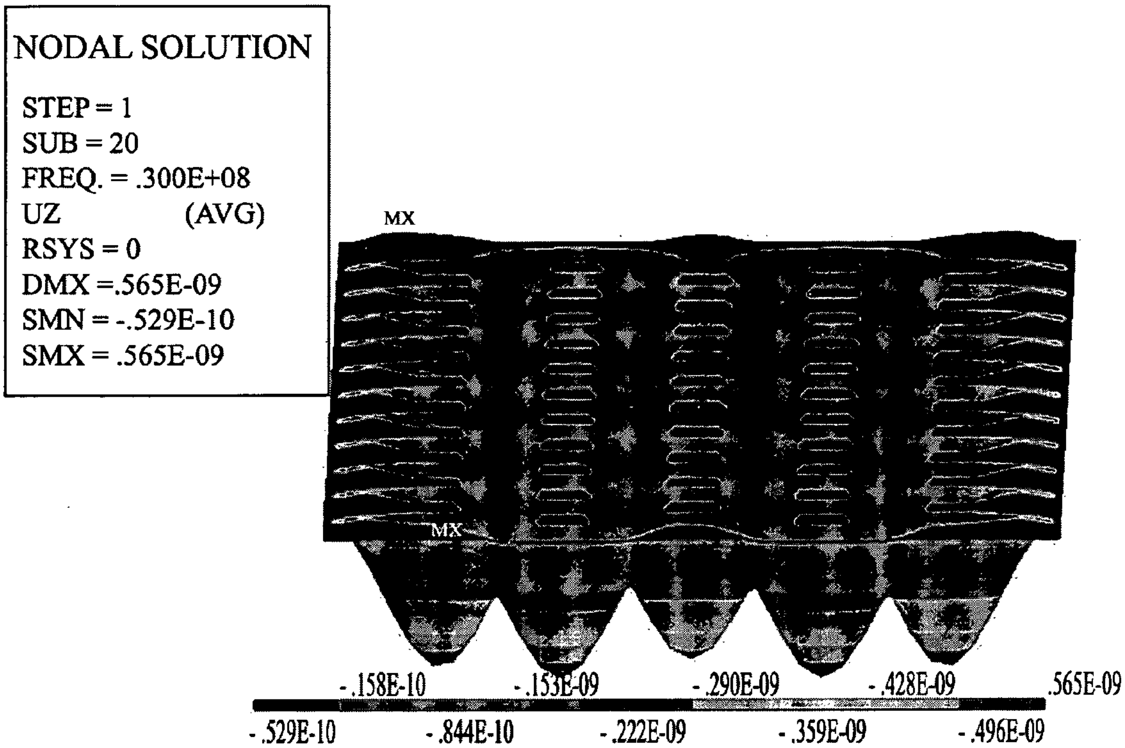
Figure 12B:
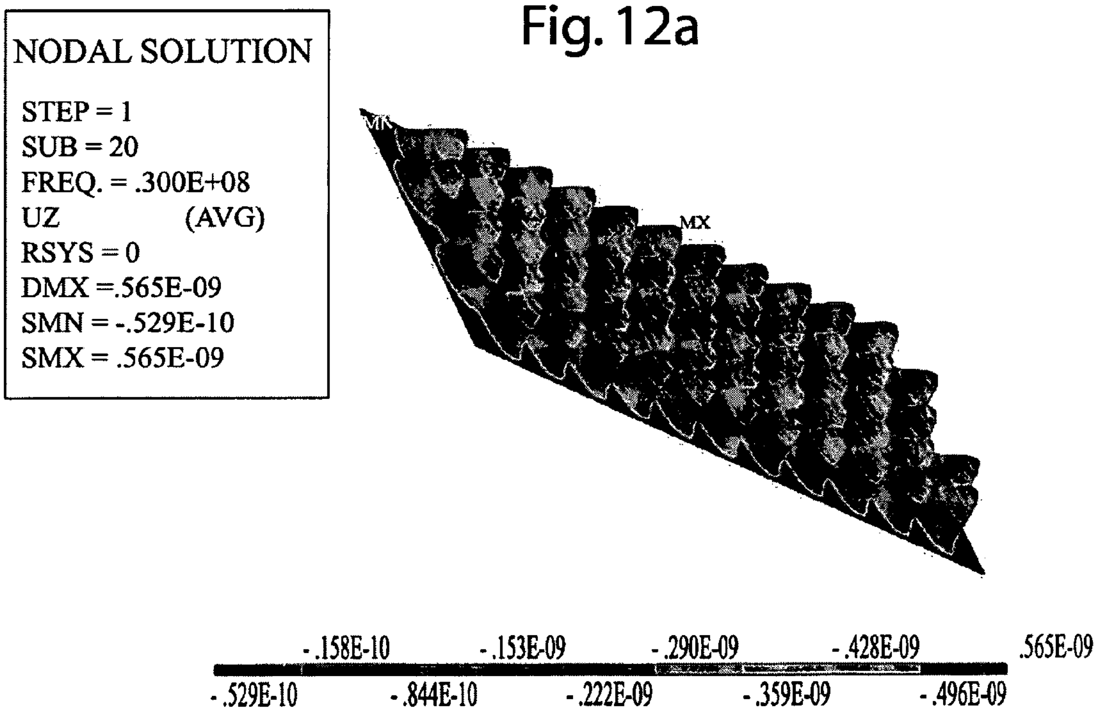
Figure 13A:
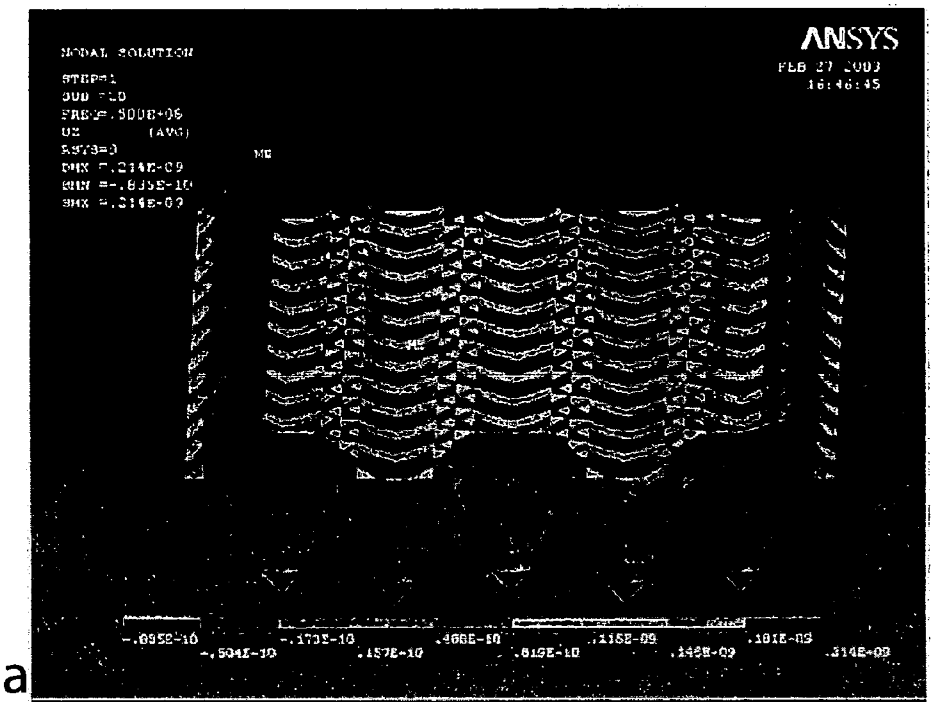
Figure 13B:
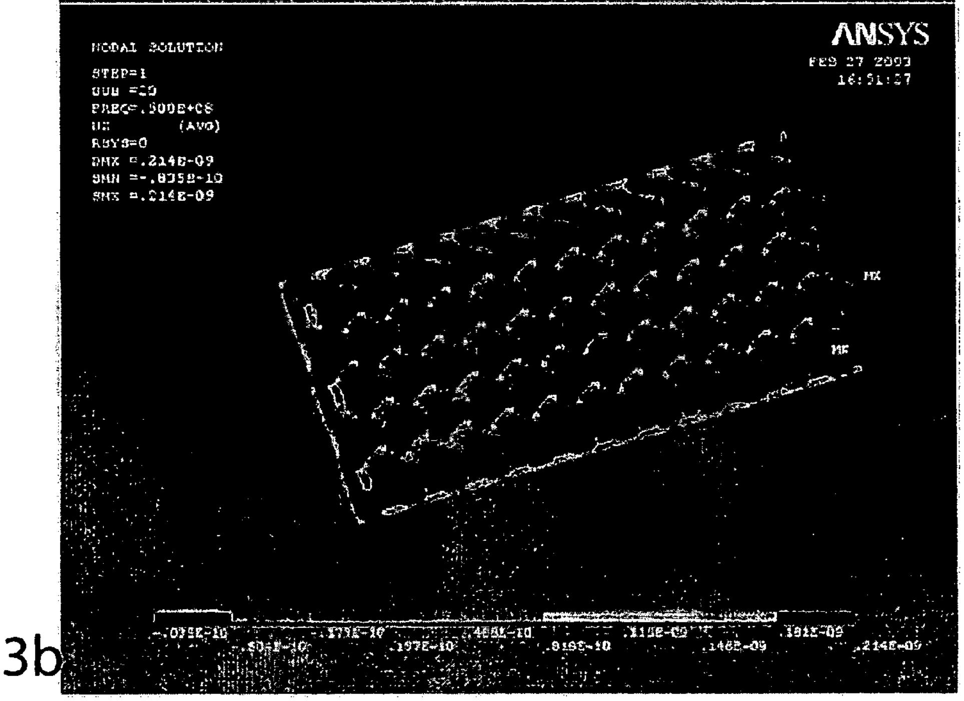

With reference to FIGS. 6*a* and 6*b*, it may be observed a preferred embodiment of the silicon micromachined transducer 20 according to the invention, which presents, from a structural point of view, features intermediate between the micromachined transducer shown in FIG. 3 and the micromachined transducer shown in FIG. 4, while it presents, from a performance point of view, features better than both of them.

The new micromachined transducer 20 uses a unique thin plate 21 as vibrating element, having surface equal to that of the transducer 20 that it is desired to make (as a unique membrane is used in the bulk micro-machining technique of FIG. 3), which is constrained by using an array of substantially punctiform supports 22. In particular, the vibrating plate 21 is constrained to the backplate 23, comprising a silicon substrate, through an ordered arrangement of columns 22 of small diameter, also called "pillars", operating as an array of punctiform constraints. Also, the plate is stiffly constrained along its perimeter to the backplate 23.

With respect to the bulk micro-machining technique of FIG. 3, the fundamental difference is the type of constraint existing between column 22 and plate 21 of the transducer of FIG. 6 and the constraint between membrane 2 and vertexes of the micro-pyramids 7 of the transducer of FIG. 3. Whereas in the first case the constraint avoid both rotation and translation of the plate 21 along both positive and negative Z axis (orthogonal to the plate 21), in the second one only translation of the membrane along the negative Z axis is avoided.

In the structural solution adopted in the new type of micromachined transducer of FIG. 6, the array of column constraints 22 subdivides the plate 21 in many micro-plates and hence in many elementary cells, similarly to the surface micro-machining technique of FIG. 4, with the difference that in the latter case the elementary cell is completely closed by a stiff support circular or squared or also hexagonal in shape, while in the case of FIG. 6 the micro-plate is constrained only on four vertexes 22. The single so defined micro-plates operate in a manner very similar to the operation of the elementary cells of a cMUT with micro-cells squared in shape.

The surface of the plate 21 of the transducer of FIG. 6 is metallized, through a metallization layer 24, preferably of aluminium, and the backplate 23 is conductive. Thus, by applying a bias continuous voltage $V_{DC}$ and an alternate voltage Vac of frequency f, the single micro-plates are subject to a uniform electrostatic pressure whereby they all vibrate in phase, i.e they all simultaneously spring firstly upwards and then downwards following the frequency of the applied voltage. When the frequency increases, the micro-membranes move keeping the springing amplitude constant until they reach the resonance frequency at which they vibrate with maximum amplitude. This behavior has fundamental importance as far as the application is concerned: i.e. the possibility of efficiently radiate acoustic waves in a medium. In fact, only in this case radiations emitted by the single plates constructively add up.

The inventors have carried out finite element simulations on the transducer of FIG. 6, by using ANSYS® software. In particular, simulations have been carried out on a rectangular plate of size of 30×300 micrometers stiffly constrained along the edges and provided with an array of column supports with squared section, equal to 3×3 micrometers, spaced with a step d=20 micrometers. FIGS. 7-13 show the results obtained from simulations at different excitation frequencies, and they each comprise two elevation views of the springed plate 21 observed from the shortest side ("a" Figures) and from the longest side ("b" Figures) respectively; the grey scale is correlated with the vibration amplitude, whereby the darker zones indicates the plate zones wherein maximum springing occurs. In particular, FIGS. 7, 8, 9, 10, 11, 12 and 13 refer to an excitation frequency equal to, respectively, 5 MHz, 15 MHz, 19 MHz, 19,5 MHz, 20 MHz, 30 MHz, and 50 MHz.

As it may be observed in FIGS. 7-13, the micro-plates effectively all spring in phase with spatially uniform amplitude for frequencies lower than 19 MHz. At this frequency, a spatial modulation of the amplitude begins to be observable, and which increases at 19,5 MHz.

At 20 MHz, that corresponds to the structure mechanical resonance frequency, the vibration amplitudes rapidly grow and the central part of the plate is in counterphase with the side one; beyond this frequency, all these micro-plates return in phase among them with phase opposite to the one that they had at a frequency lower than resonance, where this is a phenomenon occurring in any resonant system.

Figure 14:
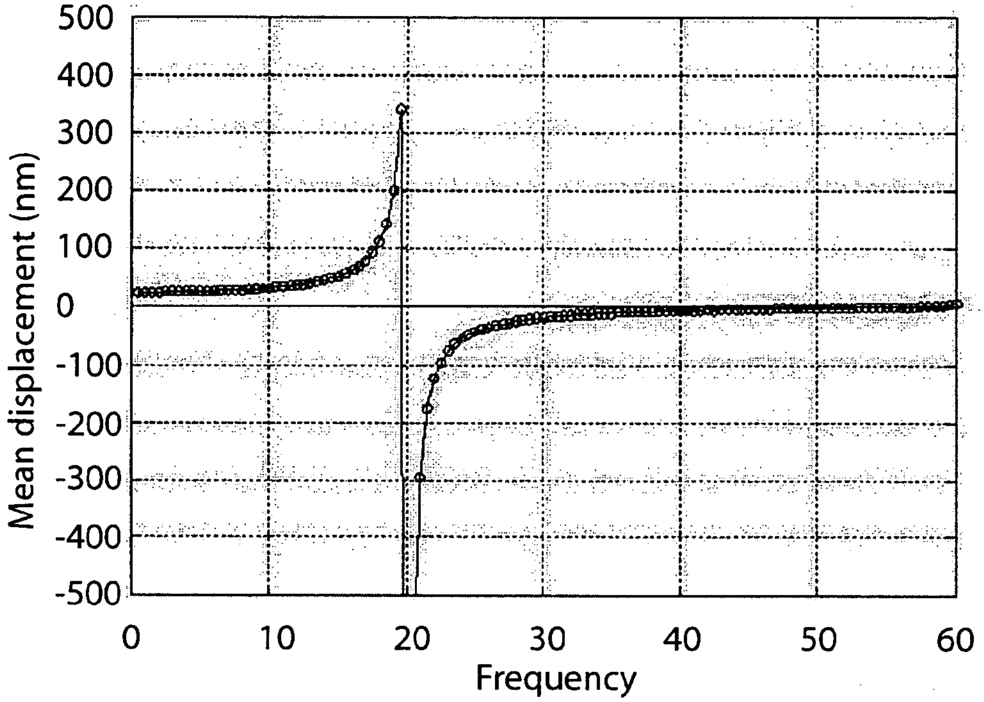
FIGS. 14-15 show further results of simulations carried out on the transducer of FIG. 6.
Figure 15:
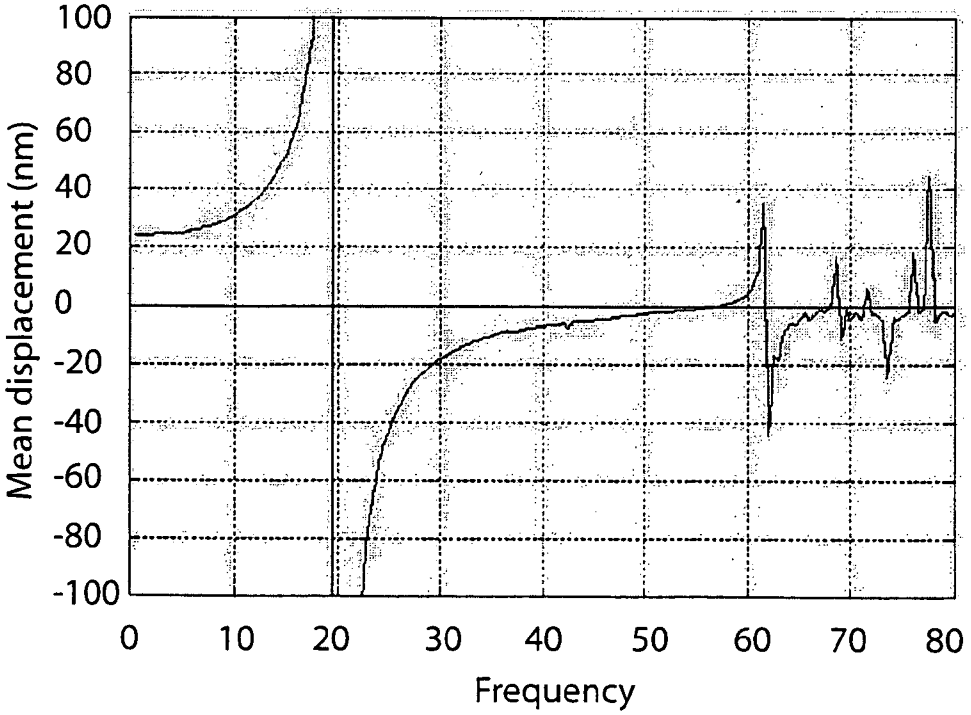

FIG. 14 shows the mean maximum movement of the plate used for the simulations as a function of frequency, while FIG. 15 shows the same parameter in a more expanded scale for a wider frequency range (0-80 MHz). Beyond 60 MHz, higher order resonance frequencies are observable, to which mean movement amplitudes much lower and a large spatial modulation of the phase of the micro-plates correspond. The device may be used as transducer of acoustic waves for frequencies lower than that of the first higher order resonance.

Figure 16:
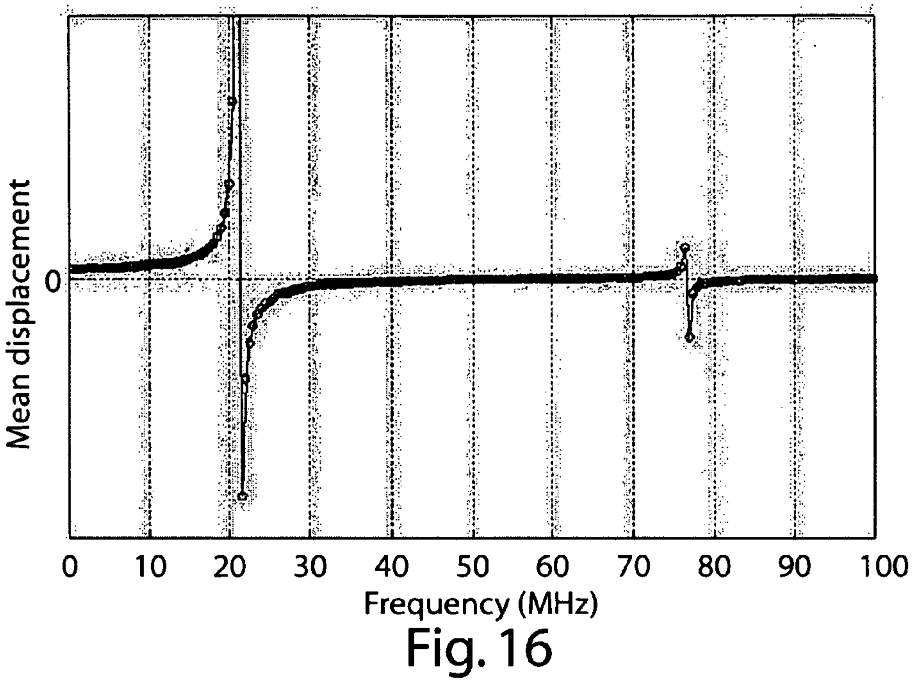
FIG. 16 shows the results of simulations carried out on a second embodiment of the micro-fabricated capacitive ultrasonic transducer according to the invention.

FIG. 16 shows the mean maximum movement of a single squared micro-plate constrained at the edges having side equal to the step d=20 micrometers of the column supports 22.

As it may be observed by comparing FIGS. 15 and 16, the micro-plates of the transducer according to the invention behave in a way very similar to the single micro-plate completely constrained at the edges at least up to the first higher order resonance; in fact, the fundamental resonance for both is almost the same frequency of 20 MHz; however, the micro-plate constrained at the edges shows the first higher order resonance at a frequency higher of about 10 MHz.

Obviously, by changing the step d of spacing the column supports 22, it is possible to change the resonance frequency of the transducer according to the invention.

Figure 17:
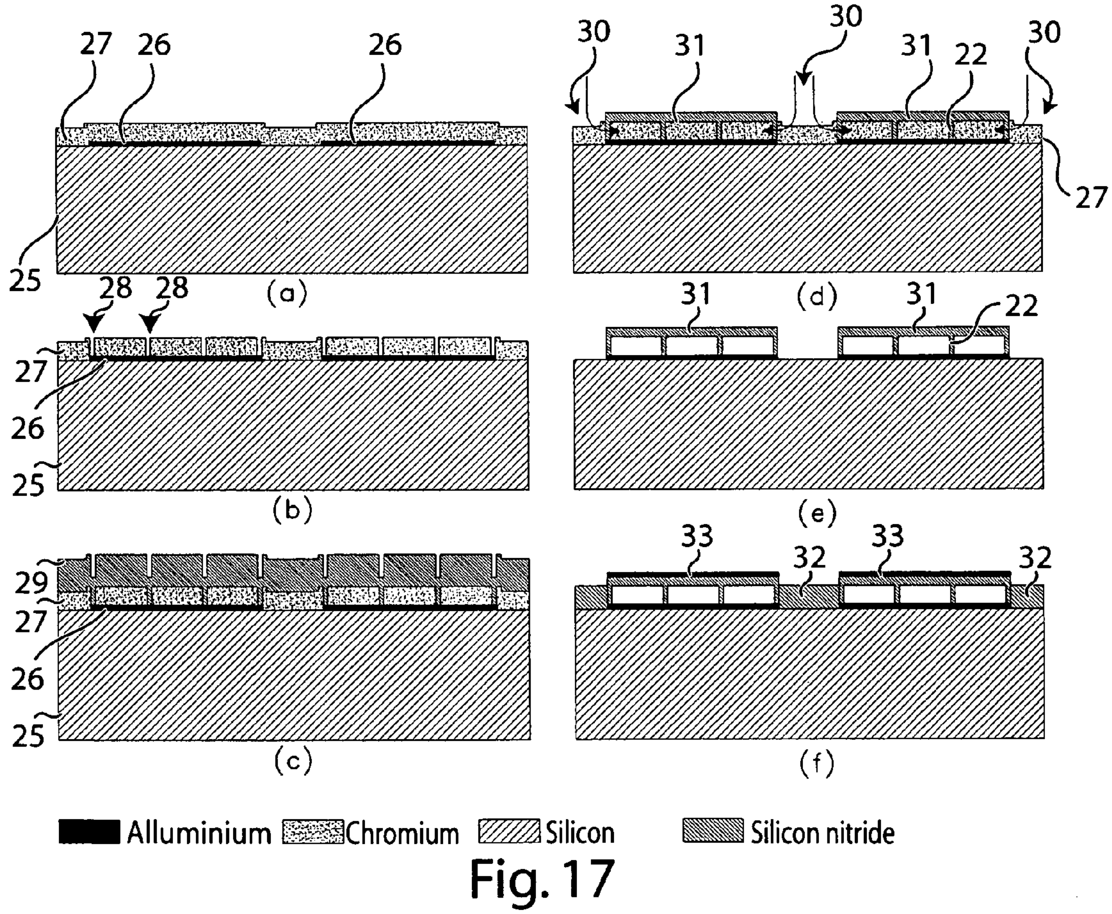
FIG. 17 shows the phases of a first embodiment of the surface micro-mechanical process for fabricating micromachined capacitive ultrasonic transducers according to the invention.

FIG. 17 shows the fundamental steps of the preferred embodiment of the process of fabrication of the capacitive ultrasonic transducer according to the invention.

As said before, the single micro-cells are defined by only four column constraints 22 and, thus, they are intercommunicating. Consequently, the sacrificial film etching may be carried out sideways to the structure avoiding to make one or more holes on each micro-membrane. In particular, by way of illustration and not by way of limitation, FIG. 17 shows the steps of fabrication of a portion of a linear multi-element transducer, made of N vibrating micro-stripes, comprising two micro-stripes.

FIG. 17*a* shows a conductive silicon substrate 25 (preferably doped with boron) on the surface of which two metallic films 26 are deposited, preferably of aluminium, which are the electrodes of the two rectangular elements. The figure also shows a chromium layer 27, acting as sacrificial layer and covering the two substrate electrodes 26.

Through the classic photolithographic techniques, in the chromium sacrificial layer 27 overlying the electrodes 26 and along all its thickness an ordered set of holes 28 preferably circular in shape is made, as shown in FIG. 17*b*.

All the holes 28 made in chromium 27 are then closed through a thick layer 29 of silicon nitride deposited all over the chromium sacrificial film 27, as shown in FIG. 17*c*.

Then, the nitride layer 29 is thinned by a classic wet etching, using a masking, down to discover the chromium 30 being in the interspace between two adjacent elements. As shown in FIG. 17*d*, at this stage of the process the vibrating plates 31 of the transducer elements have been made, each provided with a set of column supports 22 made of the nitride filling the holes 28 made in the chromium 27.

In order to free the plates 31 from the underlying chromium sacrificial layer 27, a selective wet etching is employed, which is ineffective on the silicon nitride, but capable to etch the chromium sideways. Once the plates 31 are freed from the underlying chromium, they remain suspended through the related columns 22, as shown in FIG. 17*e*. In this regard, other materials may be alternatively used instead of chromium, provided that they have appropriate chemical properties so as to be removable through a selective wet etching. Similarly, alternatively to silicon nitride, it is possible to deposit a layer 29 of other material, for instance polycrystalline silicon, having appropriate elastic mechanical properties for making the plates 31.

Afterwards, the plates 31 are covered by a resist mask, and a silicon nitride film 32 is deposited all over the transducer surface so as to fill the space being in the interspace between two adjacent elements and, thus, to seal the plates 31 along the edges, which plates are the single elements of the transducer, as shown in FIG. 17*f*. Finally, the nitride film 32 which has been deposited also on the plates 31 is removed by etching the resist mask with acetone, through the lift-off technique. The transducer is completed by depositing an aluminium film 33 on each plate 31, making the second electrode of each element of the transducer.

Figure 18:
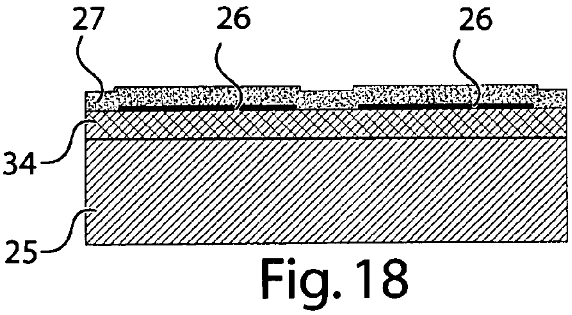
FIG. 18 shows a phase of a second embodiment of the surface micro-mechanical process for fabricating micromachined capacitive ultrasonic transducers according to the invention.

A second embodiment of the process of fabrication according to the invention may comprise a preliminary step of creation (for example through deposition or thermal growing), on the silicon substrate 25, of a silicon dioxide layer 34, as shown in FIG. 18, preferably of thickness higher than 5 micrometers, more preferably equal to about 7 micrometers, in order to reduce the stray capacity of the substrate down to values not larger than 30 picoFarad.

Further embodiments of the process of fabrication of the transducer may comprise, as material of the substrate 25 of FIG. 17*a*, quartz instead of silicon. In such case, since quartz is insulating, there is no stray capacity due to the substrate. Preferably, electric connections between the substrate electrodes 26 may be made through suitable metallic leads on the quartz substrate 25.

The described process presents a number of steps lower than or equal to those necessary to make a cMUT and, therefore, it is not more complex or heavy than this latter.

Moreover, the described process allows micro-plates to be made which structurally lacks discontinuities and may be easily sealed against external agents.

Furthermore, the structure homogeneity improves the element vibration mode, while the good lateral closing of the elements enables a better reliability.

The transducer according to the invention behaves in a manner very similar to a classical cMUT transducer made of squared cells of side equal to the step of the array of column supports, with respect to which it nevertheless presents significant advantages.

First of all, the resonance frequency is as high as the one obtained through cMUT technique, but the transducer shows a better efficiency in transmission and a higher sensitivity in reception with respect to cMUTs. In fact, for the same total transducer area, the vibrating surface of the transducer according to the invention is larger that that of the cMUT since the constraints occupy a smaller surface, quantifiable in at least 30% less with respect to the cMUT constraints. In other words, since the surface occupied by the constraints is stiff and hence reflecting, the transducer according to the invention presents a reflection factor lower by at least 30% than the cMUT one.

Moreover, the plate of the transducer according to the invention is uniform, being made without making holes in it, which, instead, in the case of the cMUT, are necessary for making the underlying micro-cavities. The structure uniformity assures a better vibration, free from spurious modes which unavoidably are excited because of small dissymetries. Also, the plate uniformity enables a lower mechanical defectiveness of the transducer.

Technology of the transducer according to the invention is simple and requires the employment of a number of masks lower than or at the most equal to those of the process of fabrication of cMUTs.

The preferred embodiments have been above described and some modifications of this invention have been suggested, but it should be understood that those skilled in the art can make other variations and changes, without so departing from the related scope of protection, as defined by the following claims

The invention claimed is:

1. A microfabricated capacitive ultrasonic transducer comprising at least one thin plate, provided with a metallization, suspended over and integrally coupled to a conductive substrate through supporting elements in the form of stiff constraints, said thin plate being subdivided by said supporting elements in a plurality of micro-cells wherein such supporting elements are located along at least one perimeter portion of each micro-cell, the conductive substrate forming one or more electrodes corresponding to said at least one thin plate, wherein said supporting elements comprise an ordered arrangement of columns or “pillars” through which the thin plate is integrally coupled to the conductive substrate, whereby the pillars operate as substantially punctiform constraints.

2. A transducer according to claim 1, wherein one or more pillars have circular section.

3. Transducer according to claim 1, characterised in that one or more pillars (22) have squared section.

4. A transducer according to claim 1, wherein the pillars form an array ordered arrangement.

5. A transducer according to claim 1, wherein the conductive substrate comprises a conductive silicon substrate.

6. A transducer according to claim 5, wherein the conductive substrate further comprises a layer of insulating material overlapping the conductive silicon substrate.

7. A transducer according to claim 5, wherein the insulating material layer is a silicon dioxide layer.

8. A transducer according to claim 5, wherein the conductive substrate further comprises at least one overlapped metallic film for each electrode.

9. A transducer according to claim 1, wherein the conductive substrate comprises a quartz substrate on which at least one metallic film (26) is overlapped for each electrode.

10. A transducer according to claim 1, wherein the thin plate comprises silicon nitride and/or polycrystalline silicon.

11. A microfabricated capacitive ultrasonic transducer comprising at least one thin plate, provided with a metallization, suspended over and integrally coupled to a conductive substrate through supporting elements in the form of stiff constraints located along at least one perimeter portion of the plate, the conductive substrate forming one or more electrodes corresponding to said at least one thin plate, wherein said supporting elements comprise an ordered arrangement of columns or "pillars" through which the thin plate is integrally coupled to the conductive substrate, whereby the pillars operate as substantially punctiform constraints, wherein the thin plate is subdivided by the pillars in a plurality of micro-cells, each one of said micro-cells having a polygonal shape comprising three or more vertexes, each one of said micro-cells being integrally coupled to pillars in correspondence with at least one part of the vertexes of the polygonal shape.

12. A transducer according to claim 11, wherein the micro-cells of said plurality have a squared polygonal shape, wherein the pillars are spaced apart with a step d.

13. Transducer according to claim 11, characterised in that the micro-cells of said plurality have a rectangular polygonal shape.

14. Transducer according to claim 11, characterised in that the micro-cells of said plurality have a regular hexagonal shape or a lozenge shape.

* * * * *